United States Patent
Kim

(10) Patent No.: US 7,575,446 B2
(45) Date of Patent: Aug. 18, 2009

(54) CHASSIS ASSEMBLY AND PLASMA DISPLAY APPARATUS INCLUDING THE SAME

(75) Inventor: Yeung-Ki Kim, Suwon-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/389,030

(22) Filed: Mar. 27, 2006

(65) Prior Publication Data
US 2006/0223348 A1    Oct. 5, 2006

(30) Foreign Application Priority Data
Apr. 1, 2005    (KR) ..................... 10-2005-0027552

(51) Int. Cl.
*H01R 4/66* (2006.01)
(52) U.S. Cl. .......................................... 439/95
(58) Field of Classification Search .................. 439/95; 361/681; 345/905, 3, 60
See application file for complete search history.

(56) References Cited

U.S. PATENT DOCUMENTS

| | | | |
|---|---|---|---|
| 2005/0068261 A1* | 3/2005 | Oh ............................ | 345/60 |
| 2005/0111175 A1* | 5/2005 | Kim ........................... | 361/681 |
| 2005/0156525 A1* | 7/2005 | Joo et al. ................... | 313/587 |

FOREIGN PATENT DOCUMENTS

| | | |
|---|---|---|
| JP | H08-45259 | 2/1996 |
| JP | H10-056283 | 2/1998 |
| JP | 3056946 | 3/1999 |
| JP | 2003-133760 | 5/2003 |
| JP | 2003-202811 | 7/2003 |
| JP | 2003-216057 | 7/2003 |
| KR | 10-2004-0024411 | 3/2004 |

OTHER PUBLICATIONS

Korean Office Action for Korean Patent Application No. 2005-0027552, issued on Oct. 25, 2006.
Japanese Office action dated Dec. 16, 2008 in Applicant's corresponding Japanese application No. 2006-042876.

* cited by examiner

*Primary Examiner*—Jean F Duverne
(74) *Attorney, Agent, or Firm*—Robert E. Bushnell, Esq

(57) ABSTRACT

A chassis assembly having an improved grounding performance and a plasma display apparatus including the chassis assembly are disclosed. The plasma display apparatus comprises: a plasma display panel displaying an image; a non-conductive chassis disposed on a rear portion of the plasma display panel for supporting the plasma display panel; a circuit unit disposed on a rear portion of the non-conductive chassis and including a circuit for driving the plasma display panel; and a conductive grounding member electrically connected to the circuit unit so as to provide the circuit unit with a ground potential.

18 Claims, 6 Drawing Sheets

CHASSIS ASSEMBLY AND PLASMA DISPLAY APPARATUS INCLUDING THE SAME

CLAIM OF PRIORITY

This application makes reference to, incorporates the same herein, and claims all benefits accruing under 35 U.S.C. § 119 from an application for CHASSIS ASSEMBLY AND PLASMA DISPLAY APPARATUS COMPRISING THE SAME earlier filed in the Korean Intellectual Property Office on 1 Apr. 2005 and there duly assigned Serial No. 10-2005-0027552.

BACKGROUND OF THE INVENTION

1. Field of the Invention

The present invention relates to a chassis assembly having improved grounding performance, and a plasma display apparatus including the chassis assembly.

2. Description of the Related Art

Flat panel display apparatuses using liquid crystal displays or plasma display panels are presently used widely to display images. Flat panel display apparatuses have superior characteristics in terms of image quality, thickness and weight, they have a wide viewing angle with large screen, and they are easily fabricated and enlarged.

In order to fabricate a lightweight flat panel display apparatus, the thickness of the chassis which supports the plasma display panel should be reduced, or a lightweight material should be used to fabricate the chassis. However, if the thickness of the chassis supporting a large plasma display panel is excessively thin, insufficient support is provided for the large plasma display panel. Therefore, when the thickness of the chassis is reduced, structural stability is also reduced. Aluminum is generally used to form the chassis, but the chassis can also be formed of a plastic material. However, when the chassis is formed of plastic material, the chassis is non-conductive, and thus, grounding of a circuit unit cannot be performed through the chassis.

SUMMARY OF THE INVENTION

The present invention provides a chassis assembly having improved grounding, and a plasma display apparatus including the chassis assembly.

According to an aspect of the present invention, a chassis assembly comprises: a non-conductive chassis; a circuit unit disposed on a first side of the chassis; and a conductive grounding member electrically connected to the circuit unit to provide the circuit unit with a ground potential.

According to another aspect of the present invention, a plasma display apparatus comprises: a plasma display panel displaying an image; a non-conductive chassis disposed on a rear portion of the plasma display panel to support the plasma display panel; a circuit unit disposed on a rear portion of the non-conductive chassis and including a circuit driving the plasma display panel; and a conductive grounding member electrically connected to the circuit unit to provide the circuit unit with a ground potential.

The chassis may include a groove, in which the grounding member is disposed, formed to a predetermined depth, and the groove may be formed in a front surface of the chassis so as to correspond to the circuit unit. The circuit unit may include a grounding portion having the ground potential, whereby the grounding portion is electrically connected to the grounding member by a conductive screw which is inserted into a penetration hole of the circuit unit. The grounding member may include a portion in which the conductive screw is inserted, the portion being burring-processed to increase a contact area with the conductive screw.

The chassis may be formed of a material including plastic. The grounding member may be formed of a material including at least one of aluminum and steel.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
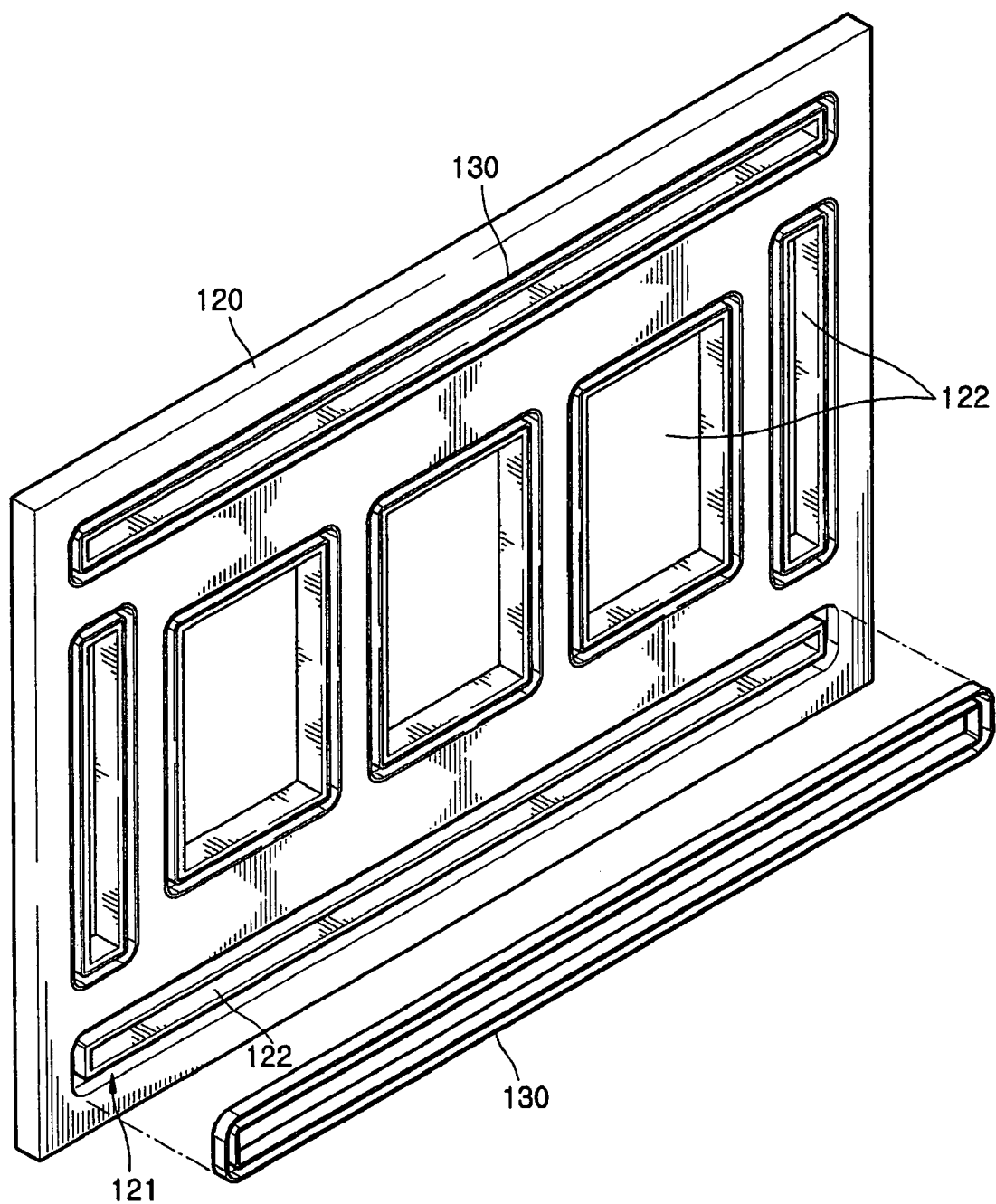
FIG. 1 is a perspective view of a chassis assembly according to an embodiment of the present invention.

FIGS. 1 thru 4 illustrate a chassis assembly according to an embodiment of the present invention. Referring to FIG. 1, the chassis assembly includes a chassis 120 and a plurality of grounding members 130.

The chassis 120 supports an image display unit, such as a plasma display panel, and it is preferable that the chassis 120 be formed so as to be thin in order to reduce the overall weight of the display apparatus. In addition, the chassis 120 is formed of a non-conductive material, and in particular, it is preferable that the chassis 120 be formed of a lightweight material composed of plastic that has high strength.

The chassis 120 substantially has the shape of a flat panel, and includes a plurality of openings 122 therein. The openings 122 are formed to correspond to circuit units 140, and the weight of the chassis 120 can be reduced by the openings 122. In addition, since spaces through which air flows can be increased by the openings 122, heat generated by the circuit units 140, which contain electronic devices 145, can be radiated efficiently.

Grooves 121 are formed on the chassis 120 so as to surround the openings 122, respectively. Each of the grooves 121 has a closed structure and a predetermined depth.

Figure 2:
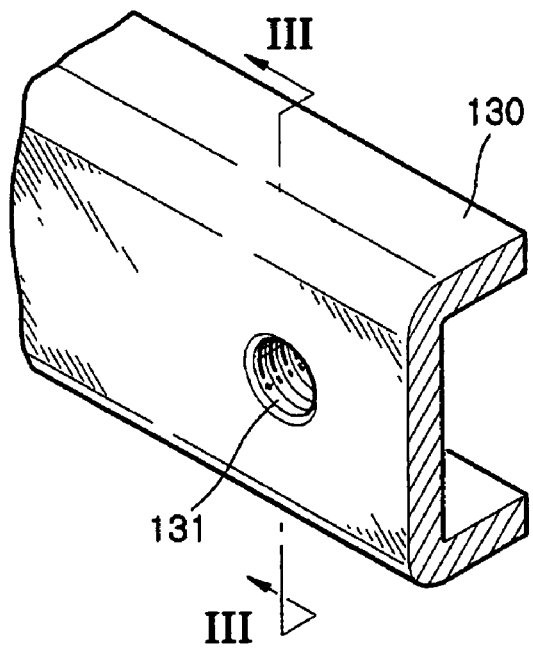
FIG. 2 is a partial perspective view of a grounding member of FIG. 1.
Figure 4:
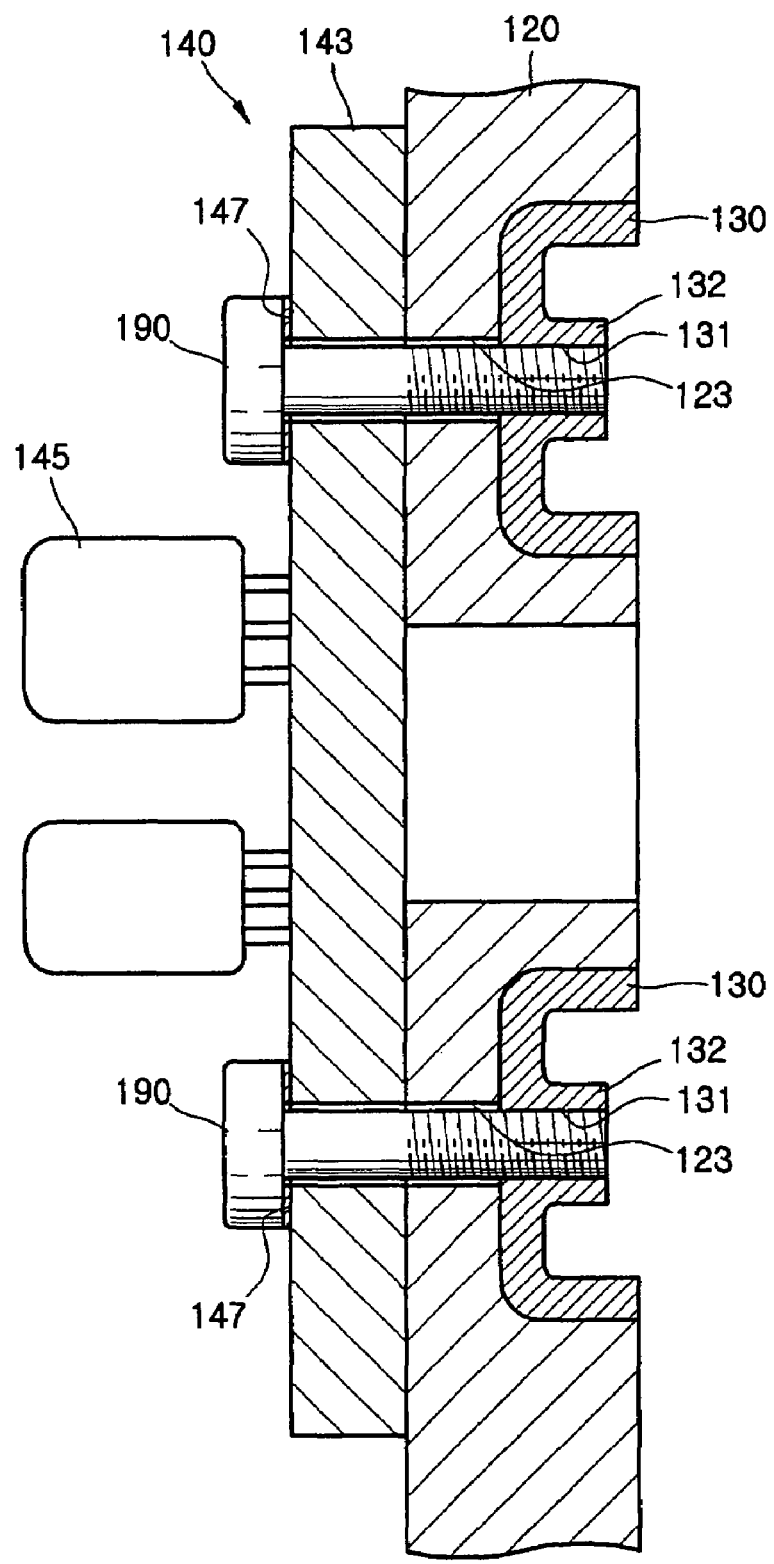
FIG. 4 is a cross-sectional view of a circuit unit fixed on the chassis assembly and the circuit unit grounded by a grounding member.

Grounding members 130 are inserted into the grooves 121. Referring to FIG. 2, the grounding members 130 have cross-sections of "⌐" shape based on a length direction of the grounding members 130. In addition, each of the grounding members 130 is disposed in a lengthwise direction of the grooves 121, and the grounding members 130 have a closed structure. Referring to FIG. 4, the grounding members 130 include penetration holes 131, and screws 190 are inserted into the penetration holes 131 so as to fix the grounding member 130 to the circuit unit 140 and to the chassis 120. The penetration holes 131 include screw threads on inner circumferential surfaces thereof so that the screws 190 can be screwed into the penetration holes 131.

It is preferable that a plurality of penetration holes 131 be formed in each grounding member 130, and the number of penetration holes 131 is determined according to the size and weight of the circuit units 140. Preferably, the penetration holes 131 are formed on portions of the grounding members 130 corresponding to corners of the grooves 121. In order to improve coupling force between the grounding members 130 and the chassis 120, the grounding members 130 can be fixed to the chassis 120 using an adhesive.

Figure 3:
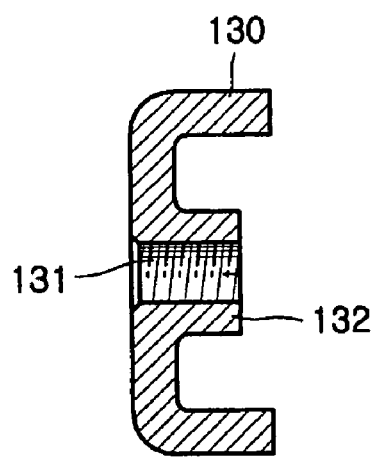
FIG. 3 is a cross-sectional view of the grounding member of FIG. 2 taken along line III-III of FIG. 2.

Referring to FIGS. 2 and 3, the penetration holes 131 of the grounding members 130, into which the screws 190 are inserted, is burring-processed. A length of the penetration hole 131 can extend inward by the burring process, and thus, the contact area between the screws 190 and the grounding members 130 can be increased. Therefore, the screws 190 are not separated from the grounding members 130 during the fabrication processes of the plasma display apparatus, and thus, the grounding performance of the grounding member 130 can be improved. The improvement of the grounding performance will be described in more detail later. The grounding members 130 are formed of a conductive material so as to ground the circuit unit 140, and more preferably, they can be formed of aluminum thin sheet or stainless thin sheet.

Referring to FIG. 4, a substrate 143 of the circuit unit 140 is disposed on the chassis 120. The substrate 143 is adhered onto the chassis 120 according to the current embodiment. However, the substrate 143 can be separated by a predetermined distance from the chassis 120. Circuit lines (not shown) for processing electric signals are formed on the substrate 143 of the circuit unit 140, and electronic devices 145 are connected to the circuit lines. At least one of the circuit lines is a circuit line providing a ground potential. In general, a grounding portion 147 surrounding the penetration hole 131 formed in the substrate 143 is also formed on the substrate 143, and the grounding portion 147 is electrically connected to the circuit line (not shown) providing the ground potential. The conductive screws 190 are inserted into the penetration holes 131 so as to be inserted into penetration holes 123 of the chassis 120, the holes 123 being formed in alignment with respective penetration holes 131. Then, the conductive screws 190 are electrically connected to the grounding members 130 that are formed on another side of the chassis 120. That is, the circuit line (not shown) having the ground potential is electrically connected to the grounding members 130 through the grounding portions 147 and the screws 190. Therefore, the circuit unit 140 can be grounded by the above grounding structure.

Figure 5:
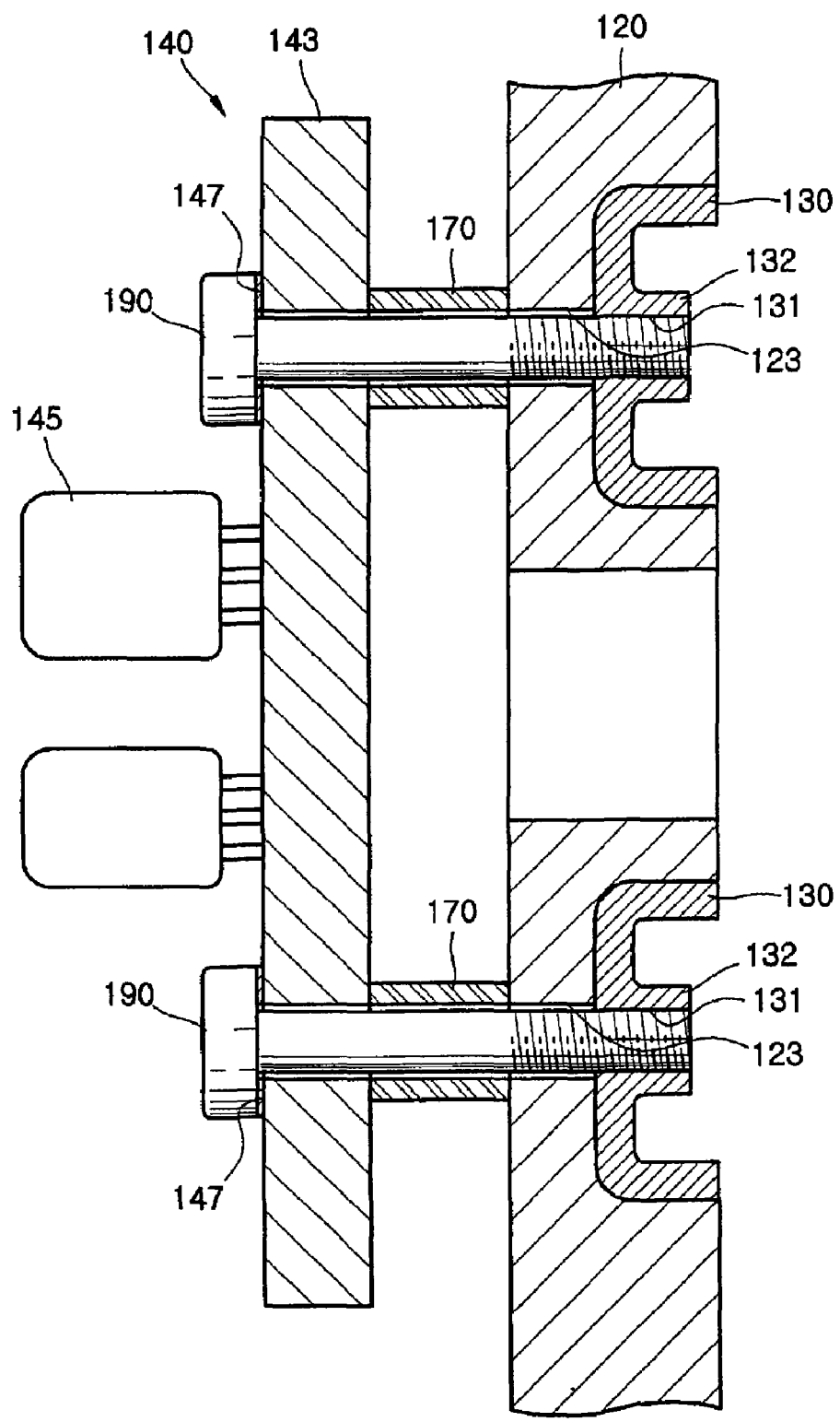
FIG. 5 is a cross-sectional view of the chassis assembly of FIG. 1 coupled to the circuit unit in a manner different from that of FIG. 4.

FIG. 5 is a cross-sectional view of the chassis assembly coupled to the circuit unit 140 in a manner different from that of FIG. 4. Like reference numerals denote like elements.

The chassis assembly is coupled to the circuit unit 140 in a manner different from that of FIG. 4 in that the circuit unit 140 is separated by a predetermined distance from the chassis 120 by a plurality of bosses 170. A plastic chassis generally has low thermal conductivity. However, since a space is formed between the circuit unit 140 and the chassis 120 due to the bosses 170, air can flow therebetween. Therefore, the heat transfer efficiency of the circuit unit 140 can be improved. The grounding of the circuit unit 140 using the screws 190 and the grounding members 130 can be performed in a manner similar to that of the previous embodiment, and thus, a detailed description thereof will be omitted.

The chassis assembly according to the embodiments of the present invention can be applied to various flat panel display apparatuses, for example, liquid crystal display (LCD) apparatuses and plasma display apparatuses. Plasma display apparatuses using plasma display panels are flat panel displays displaying an image using a gas discharge, and are considered to be the next generation of flat panel displays due to high display properties, such as display capacity, brightness, contrast, residual image, and viewing angle.

Figure 6:
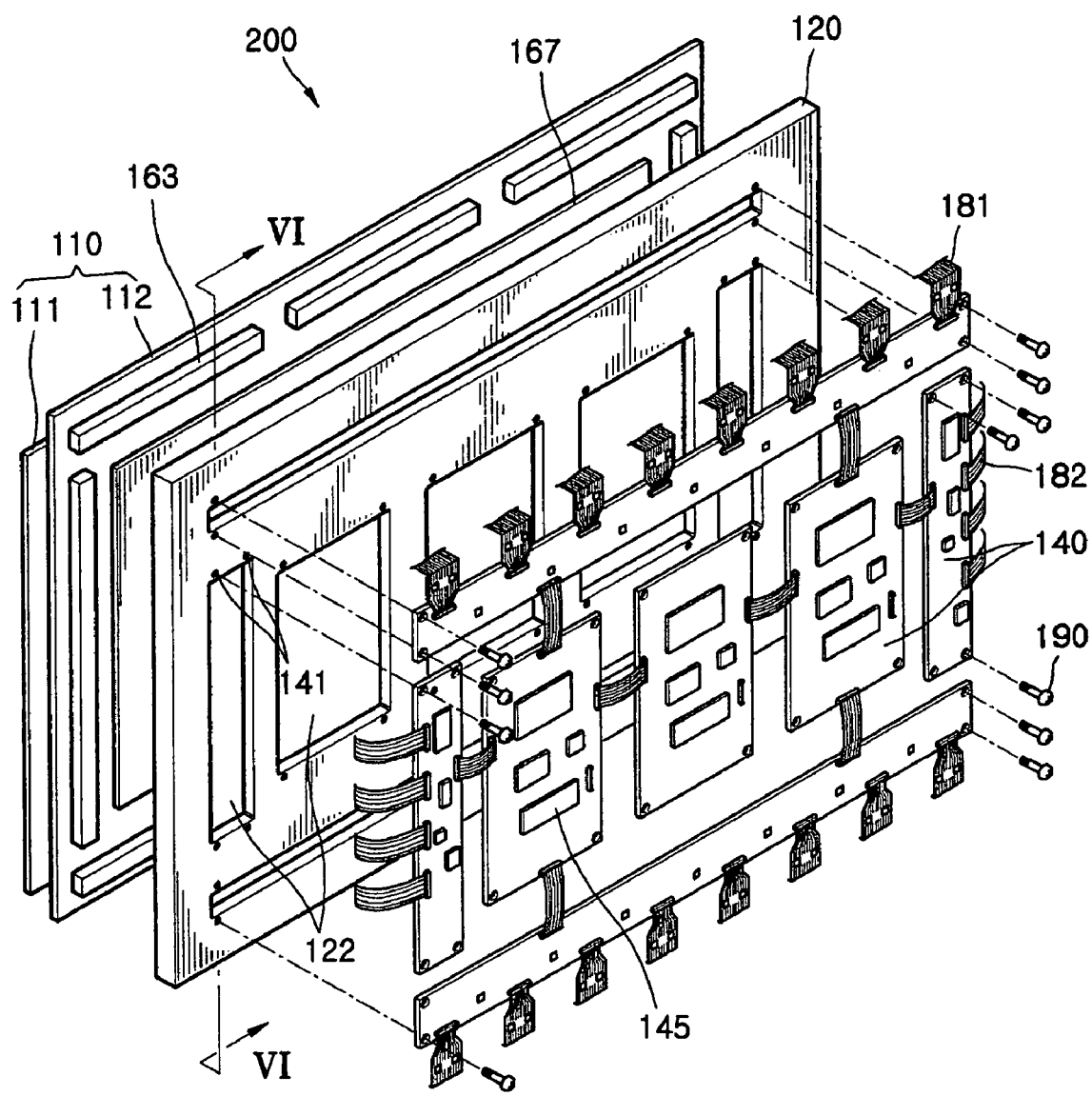
FIG. 6 is an exploded perspective view of a plasma display apparatus including the chassis assembly of FIG. 1.
Figure 7:
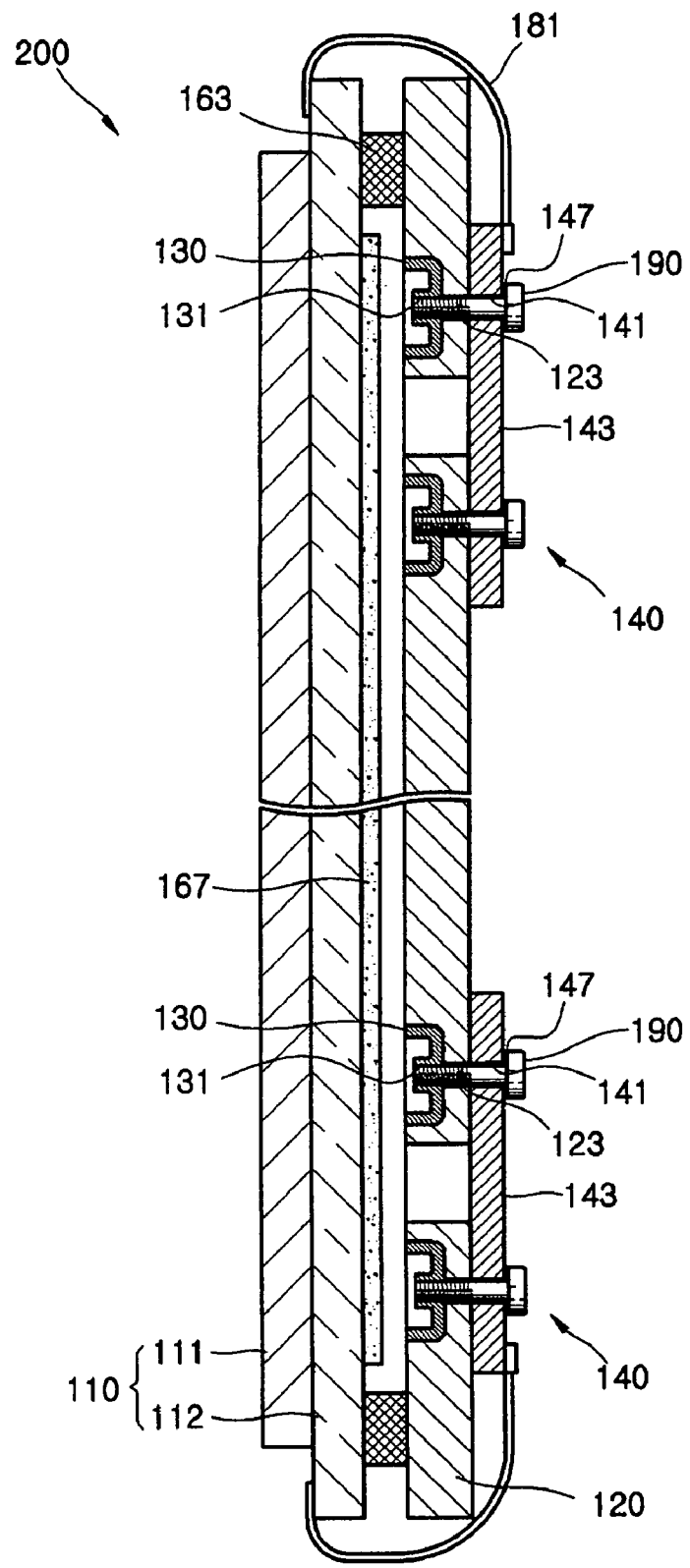
FIG. 7 is a cross-sectional view of the plasma display apparatus of FIG. 6 taken along line VII-VII of FIG. 6.

A plasma display apparatus 200 according to an embodiment of the present invention will be described with reference to FIGS. 6 and 7. FIG. 6 is an exploded perspective view of the plasma display apparatus 200 including the chassis assembly of FIG. 1, and FIG. 7 is a cross-sectional view of the plasma display apparatus 200 taken along line VII-VII of FIG. 6. For the same elements as those of the previous description, the same reference numerals will be used.

Referring to FIGS. 6 and 7, the plasma display apparatus 200 includes a plasma display panel 110 including a front panel 111 and a rear panel 112, a chassis 120 disposed on a rear portion of the plasma display panel 110 to support the plasma display panel 110, and a plurality of circuit units 140 disposed on a rear portion of the chassis 120 and including circuits for driving the plasma display panel 110.

The front panel 111 and the rear panel 112 of the plasma display panel 110 are coupled to each other, and a gas discharge occurs in a space formed between the front panel 111 and rear panel 112 to display images. In addition, the circuit units 140 driving the plasma display panel 110 are electrically connected to the plasma display panel 110 by connection units, such as tape carrier packages (TCPs) 181 or connection cables 182.

Referring to FIG. 7, a circuit line (not shown) formed on the circuit units 140 and having a ground potential is electrically connected to a plurality of grounding members 130 through a grounding portion 147 and screws 190. The circuit units 140 are grounded by means of the above grounding structure.

A plurality of thermal conductive sheets 167 is disposed between the plasma display panel 110 and the chassis 120 to diffuse and radiate the heat generated by the plasma display panel 110. The plasma display panel 110 and the chassis 120 are fixed to each other using dual-adhesive tapes 163.

According to the chassis assembly and the plasma display apparatus of the present invention, the circuit units are electrically connected to the grounding members, and thus, the grounding performance of the circuit units can be improved. Therefore, a designer is free to design the circuit units.

In addition, since grounding members are included, the chassis can be formed of a material including plastic. Therefore, the weight of the chassis can be reduced, and fabrication costs can be reduced.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. A chassis assembly, comprising:
   a non-conductive chassis;
   a circuit unit disposed on a first side of the chassis; and
   a conductive grounding member disposed on a second side of the chassis and electrically connected to the circuit unit for providing the circuit unit with a ground potential;
   wherein the circuit unit comprises a grounding portion having the ground potential, and the grounding portion is electrically connected to the conductive grounding member by a conductive connector which is inserted into a penetration hole of the circuit unit.

2. The chassis assembly of claim 1, wherein the chassis comprises a groove in which the conductive grounding member is disposed, the groove being formed to a predetermined depth.

3. The chassis assembly of claim 2, wherein the groove is formed so as to correspond to a circuit unit disposed on a second side of the chassis, wherein the second side is a side opposite to the first side on the chassis.

4. The chassis assembly of claim 1, wherein the conductive grounding member comprises a portion in which the conductive connector is inserted, the portion being burring-processed to increase a contact area with the conductive connector.

5. The chassis assembly of claim 1, wherein the conductive grounding member has a cross-sectional "[" shape.

6. The chassis assembly of claim 1, wherein the chassis is formed of a material including plastic.

7. The chassis assembly of claim 1, wherein the conductive grounding member is formed of a thin sheet.

8. The chassis assembly of claim 1, wherein the conductive grounding member is formed of a material including at least one of aluminum and steel.

9. A chassis assembly comprising:
a non-conductive chassis;
a circuit unit disposed on a first side of the chassis; and
a conductive grounding member disposed on a second side of the chassis and electrically connected to the circuit unit for providing the circuit unit with a ground potential;
wherein the chassis comprises a groove in which the conductive grounding member is disposed, the groove being formed to a predetermined depth; and
wherein the chassis comprises an opening at a portion corresponding to the circuit unit, and the groove is formed so as to surround the opening.

10. A plasma display apparatus, comprising:
a plasma display panel displaying an image;
a non-conductive chassis disposed on a rear portion of the plasma display panel for supporting the plasma display panel;
a circuit unit disposed on a rear portion of the non-conductive chassis, and including a circuit for driving the plasma display panel; and
a conductive grounding member disposed on a portion other than the rear portion of the non-conductive chassis and electrically connected to the circuit unit for providing the circuit unit with a ground potential:
wherein the circuit unit comprises a grounding portion having the around potential, and the grounding portion is electrically connected to the conductive grounding member by a conductive connector which is inserted into a penetration hole of the circuit unit.

11. The apparatus of claim 10, wherein the chassis comprises a groove in which the conductive grounding member is disposed, the groove being formed to a predetermined depth.

12. The apparatus of claim 11, wherein the groove is formed in a front surface of the chassis so as to correspond to the circuit unit.

13. The apparatus of claim 10, wherein the conductive grounding member comprises a portion in which the conductive connector is inserted, the portion being burring-processed to increase a contact area with the conductive connector.

14. The apparatus of claim 10, wherein the conductive grounding member has a cross-sectional "[" shape.

15. The plasma display apparatus of claim 10, wherein the chassis is formed of a material including plastic.

16. The apparatus of claim 10, wherein the conductive grounding member is formed of a thin sheet.

17. The apparatus of claim 10, wherein the conductive grounding member is formed of a material including at least one of aluminum and steel.

18. A plasma display apparatus, comprising:
a plasma display panel displaying an image;
a non-conductive chassis disposed on a rear portion of the plasma display panel for supporting the plasma display panel;
a circuit unit disposed on a rear portion of the non-conductive chassis, and including a circuit for driving the plasma display panel; and
a conductive grounding member disposed on a portion other than the rear portion of the non-conductive chassis and electrically connected to the circuit unit for providing the circuit unit with a ground potential;
wherein the chassis comprises a groove in which the conductive grounding member is disposed, the groove being formed to a predetermined depth; and
wherein the chassis comprises an opening at a portion corresponding to the circuit unit, and the groove is formed so as to surround the opening.

* * * * *